(12) United States Patent
Kang et al.

(10) Patent No.: US 7,560,759 B2
(45) Date of Patent: Jul. 14, 2009

(54) SEMICONDUCTOR DEVICE AND METHOD OF MANUFACTURING THE SAME

(75) Inventors: Hee-Soo Kang, Suwon-si (KR); Jae-Man Yoon, Seoul (KR); Dong-Gun Park, Sungnam-si (KR); Sang-Yeon Han, Suwon-si (KR); Young-Joon Ahn, Yuseong-gu (KR); Choong-Ho Lee, Sungnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 79 days.

(21) Appl. No.: 11/637,793

(22) Filed: Dec. 13, 2006

(65) Prior Publication Data

US 2007/0085127 A1 Apr. 19, 2007

Related U.S. Application Data

(62) Division of application No. 11/046,722, filed on Feb. 1, 2005, now Pat. No. 7,166,514.

(30) Foreign Application Priority Data

Feb. 2, 2004 (KR) ................................. 2004-6524

(51) Int. Cl.
*H01L 29/06* (2006.01)

(52) U.S. Cl. ........................ 257/288; 257/341; 257/350; 257/401; 257/900

(58) Field of Classification Search .................. 257/288, 257/341, 350, 401, 900, E27.099, E29.027, 257/E29.263, E21.579; 438/637, 638
See application file for complete search history.

(56) References Cited

U.S. PATENT DOCUMENTS

| | | | |
|---|---|---|---|
| 5,675,164 A | 10/1997 | Brunner et al. | |
| 6,188,110 B1 * | 2/2001 | Gardner et al. | 257/368 |
| 6,413,802 B1 | 7/2002 | Hu et al. | |
| 6,429,481 B1 * | 8/2002 | Mo et al. | 257/341 |
| 6,525,403 B2 | 2/2003 | Inaba et al. | |
| 6,969,888 B2 * | 11/2005 | Williams et al. | 257/341 |
| 2001/0006831 A1 * | 7/2001 | Luo | 438/138 |
| 2002/0036290 A1 | 3/2002 | Inaba et al. | |
| 2004/0108559 A1 * | 6/2004 | Sugii et al. | 257/411 |
| 2004/0145015 A1 * | 7/2004 | Mo et al. | 257/341 |
| 2004/0191994 A1 * | 9/2004 | Williams et al. | 438/270 |
| 2005/0170593 A1 | 8/2005 | Kang et al. | |

FOREIGN PATENT DOCUMENTS

JP 7249768 9/1995
KR 10-2003-0065864 8/2003

* cited by examiner

*Primary Examiner*—Michelle Estrada
(74) *Attorney, Agent, or Firm*—Volentine & Whitt, PLLC

(57) ABSTRACT

A fin type MOSFET and a method of manufacturing the fin type MOSFET are disclosed. Gate structures in the fin type MOSFET are formed by a damascene process without a photolithography process. Impurities used to form a channel region are selectively implanted into portions of a semiconductor substrate adjacent to the gate structures.

19 Claims, 16 Drawing Sheets

SEMICONDUCTOR DEVICE AND METHOD OF MANUFACTURING THE SAME

CROSS-REFERENCE TO RELATED APPLICATIONS

This is a divisional of application Ser. No. 11/046,722, filed Feb. 1, 2005 now U.S. Pat. No. 7,166,514, which is incorporated herein by reference in its entirety.

BACKGROUND OF THE INVENTION

1. Field of the Invention

The present invention relates generally to a semiconductor device and a method of manufacturing the semiconductor device. More particularly, the present invention relates to a fin type metal oxide semiconductor field effect transistor (MOSFET), and a method for manufacturing the fin type MOSFET.

2. Description of the Related Art

Modern semiconductor devices typically have high response speeds, low power consumptions, and high degrees of integration. MOSFETs commonly use a reduced channel length to attain higher response speeds. However, where the channel length is decreased in a conventional MOSFET having a planar structure, the channel driving force often decreases and an electric field caused by a drain voltage have an increased effect on the performance of the MOSFET, thereby causing a short channel effect in the conventional planar type MOSFET. Accordingly, to reduce the short channel effect and to ensure a high degree of integration, a fin type MOSFET has been developed.

The fin type MOSFET generally includes a three-dimensional channel region. In particular, the fin type MOSFET has a fin shaped active region and a gate structure enclosing the fin shaped active region. In other words, the gate electrode of the gate structure is formed on a sidewall of the fin shaped active region as well as on an upper face of the active region. As a result, the fin type MOSFET has the three-dimensional channel formed between the gate electrode and the fin shaped active region so that the short channel effect is minimized in the fin type MOSFET A conventional fin type MOSFET is disclosed, for example, in U.S. Pat. No. 6,413,802 issued to Hu et al. Hu discloses a MOSFET having a plurality of thin fin channels provided between source/drain regions on a semiconductor substrate. However, since this fin type MOSFET is formed on a silicon-on-insulator (SOI) substrate, it may have an increased manufacturing cost. In addition, a floating body effect may occur in the fin type MOSFET because the body of the MOSFET does not directly contact the SOI substrate. As a result, the MOSFET may be deteriorated due to heat generated therein because the heat is not easily transferred from the body of the MOSFET Japanese Laid Open Patent Publication No. 2002-110963 discloses a method of manufacturing a fin type MOSFET on a bulk silicon substrate. In the method of manufacturing the fin type MOSFET, a fin shaped active region having relatively large height is formed on the bulk silicon substrate. However, a gate structure is typically imprecisely formed on the fin shaped active region due to a relatively high step generated between the fin shaped active region and adjacent portions of the bulk silicon substrate. Hence, etched residues generated in the etching process for the gate structure typically remain on or near the fin shaped active region, causing an electrical failure of the fin type MOSFET. Additionally, the junction capacitance of the fin type MOSFET often increases because impurities used to form a channel region are implanted into undesired portions of the bulk silicon substrate.

SUMMARY OF THE INVENTION

The present invention provides a fin type MOSFET having improved reliability by reducing a junction capacitance thereof without a short channel effect.

The present invention also provides a method of manufacturing a fin type MOSFET having improved reliability.

According to one embodiment of the present invention, a semiconductor device comprises a semiconductor substrate having an active area and a field area. The active area has a first active region having conductive structures and a second active region having a width larger than a width of the first active region. The field area has a first field region having a height substantially smaller than a height of the first active region and a second field region having a height substantially the same as a height of the second active region. Gate structures are typically formed in the first active region and the first field region.

According to another embodiment of the present invention, a method of manufacturing a semiconductor device comprises forming a field region and an active region in a semiconductor substrate by forming a field layer on the semiconductor substrate. The method further comprises forming gate trench patterns on the semiconductor substrate, wherein the gate trench patterns selectively expose portions of the semiconductor substrate. The method further comprises partially removing portions of the field layer exposed by the gate trench patterns and selectively reducing a width of the active region, wherein a sidewall of the active region is exposed in accordance with a partial removal of the field oxide layer. The method further comprises forming a gate conductive layer on the semiconductor substrate to cover the gate trench patterns and forming gate structures on the substrate by partially removing the gate conductive layer, wherein the gate structures are separated from each other by the gate trench patterns. The method further comprises removing the gate trench patterns.

According to the present invention, the gate structures of the fin type MOSFET are formed by a damascene process without a photolithography process to thereby advantageously adjust the widths of the gate structures. Additionally, impurities used to form a channel region are selectively implanted into the portions of the substrate adjacent to the gate structures so that the fin type MOSFET may have a reduced junction capacitance.

BRIEF DESCRIPTION OF THE DRAWINGS

Embodiments of the invention are described in relation to the accompanying drawings. Throughout the drawings like reference numbers indicate like exemplary elements, components, or steps and the thickness of layers is exaggerated for clarity. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow. It will be understood that when a first element such as a layer, region, or substrate is referred to as being "on" or "onto" second element, the first element is either directly on the second element or is separated from the second element by intervening elements.

Figure 1:
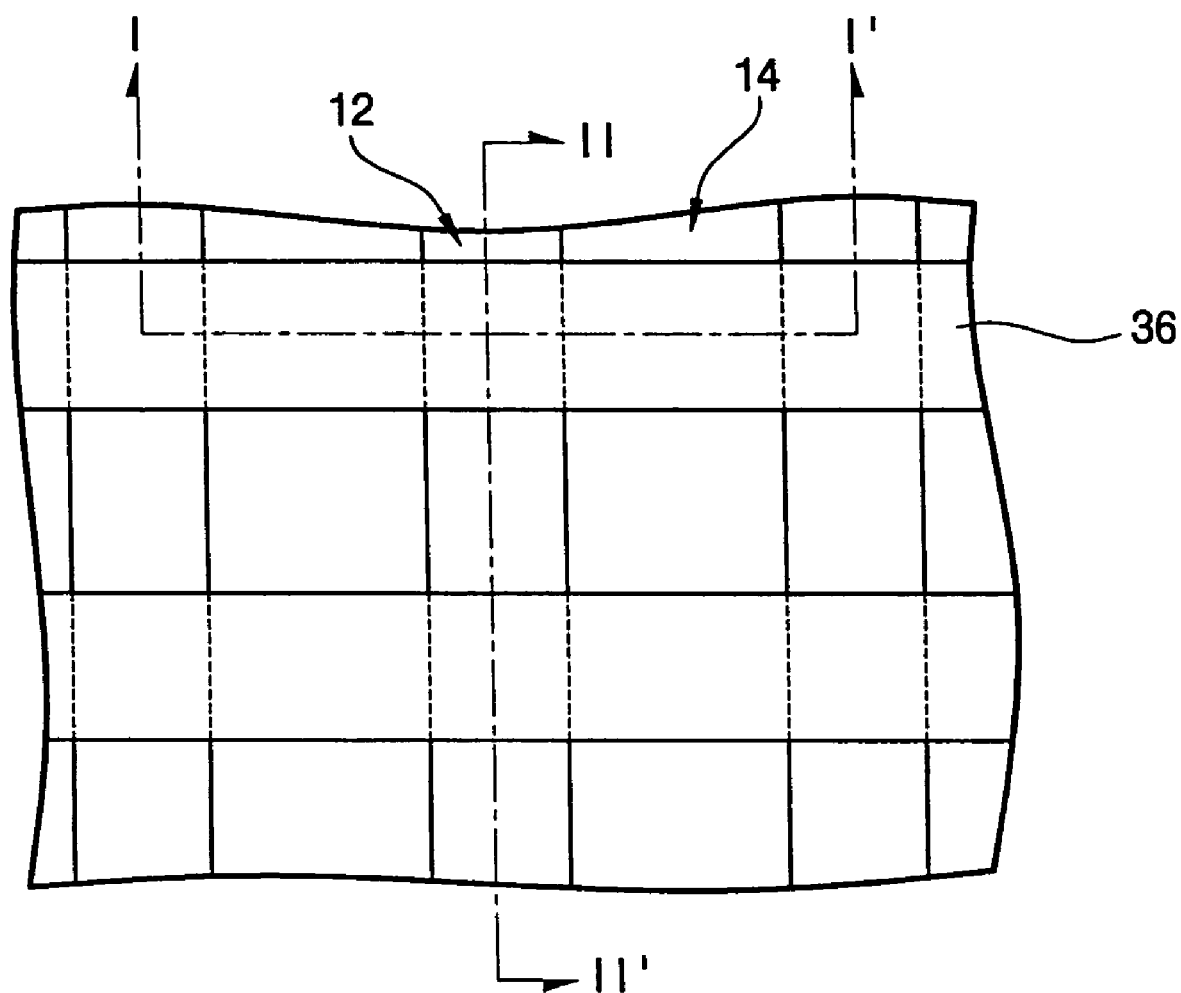
FIG. 1 is a planar view illustrating a fin type MOSFET in accordance with one embodiment of the present invention.
Figure 2A:
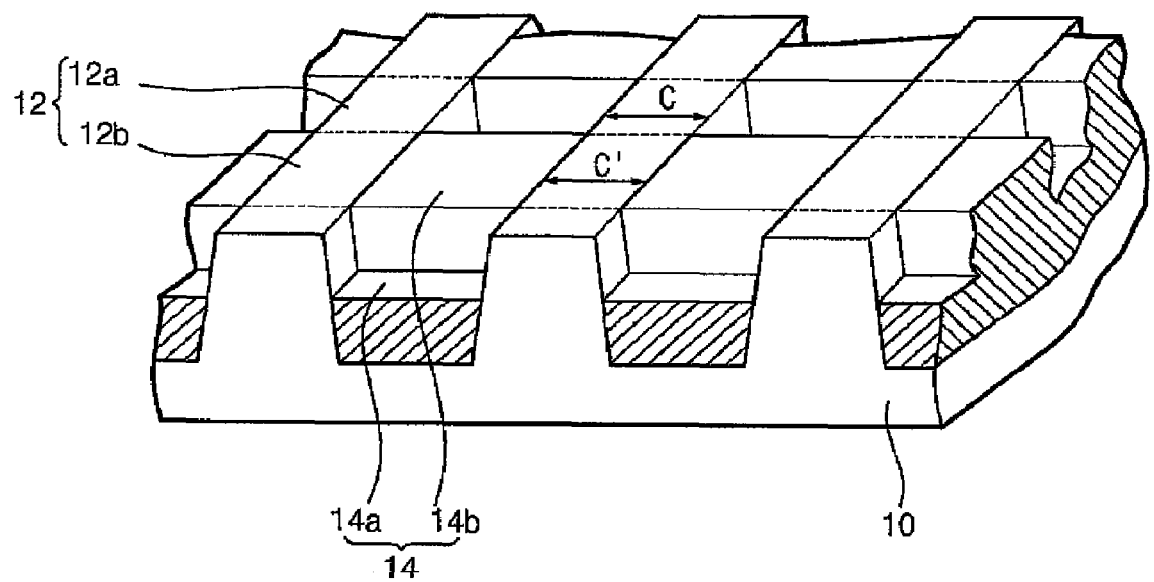
FIGS. 2A and 2B is a perspective view illustrating an active area and a field area of the fin type MOSFET in FIG. 1.
Figure 2B:
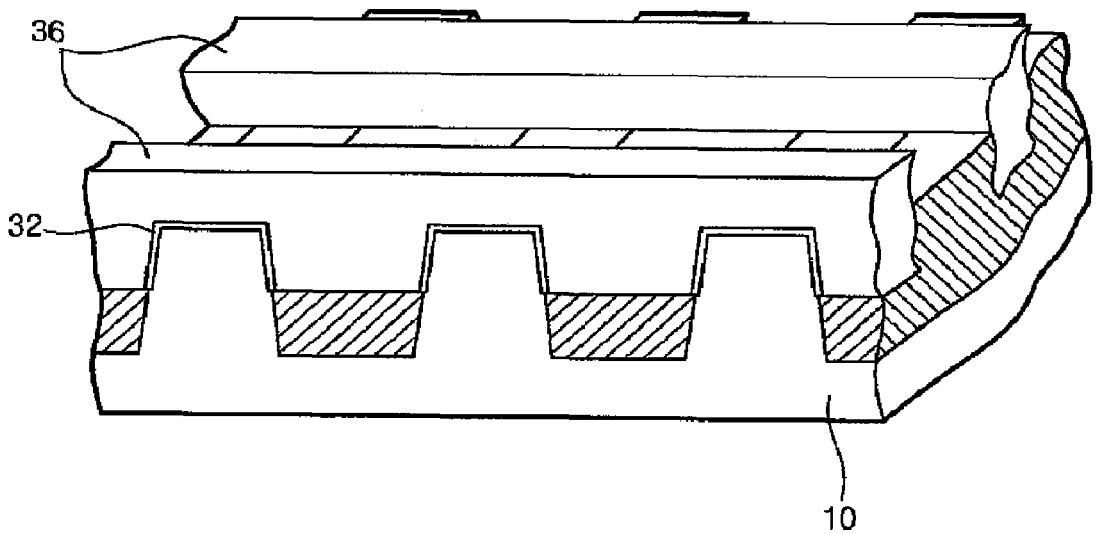

FIG. 1 is a planar view illustrating a fin type MOSFET in accordance with one embodiment of the present invention, and FIGS. 2A and 2B are perspective views of the fin type MOSFET shown in FIG. 1.

Referring to FIGS. 1, 2A, and 2B, the fin type MOSFET includes a semiconductor substrate 10 divided into an active area 12 and a field area 14. Conductive structures including gate structures, source/drain regions, and a contact, are located in active area 12. Field area 14 isolates conductive structures from other adjacent conductive structures. For example, each of the gate structures includes a gate insulation pattern 32 and a gate conductive pattern 36. Field area 14 has trenches filled with field oxide layer patterns.

Active area 12 includes a first active region 12a containing gate structures and a second active region 12b having the source/drain regions and the contact.

Field area 14 has a first field region 14a containing gate structures and a second field region 14b located adjacent to second active region 12b in which source/drain regions and the contact are located.

First active region 12a is contiguous to first field region 14a because gate structures are located in first active region 12a and first field region 14a. First field region 14a has a height substantially smaller than that of first active region 12a. In other words, first active region 12a has a fin shape that protrudes over first field region 14a. Thus, there is a step between first active region 12a and first field region 14a.

Since the gate structures are not located in second active region 12b or second field region 14b, second active region 12b is adjacent to second field region 14b. Second active region 12b has a height substantially the same as that of second field region 14b. Additionally, second field region 14b has a height substantially the same as that of first active region 12a.

The fin type MOSFET includes gate insulation patterns 32 and gate conductive patterns 36. Gate insulation patterns 32 are located in both first active region 12a and first field region 14a. Gate insulation patterns 32 are typically formed using oxide in a thermal oxidation process. Gate conductive patterns 36 are located on gate insulation patterns 32. Gate conductive patterns 36 completely cover the step between first active region 12a and first field region 14a. Additionally, each of gate conductive patterns 36 has a predetermined thickness measured from an upper face of first active region 12a. Furthermore, gate conductive patterns 36 have level upper faces.

First active region 12a has a width "C" which is substantially the same as a width "C'" of second active region 12b as shown in FIG. 2A. Widths "C" and "C'" of first and second active regions 12a and 12b typically correspond to the length of active area 12 along a direction perpendicular to a direction in which a drain current flows.

The fin type MOSFET of the present embodiment includes a fin shaped active region that is selectively located in a portion of a semiconductor substrate where a gate structure is located. The gate structure encompasses both lateral portions of the fin shaped active region and also covers an upper face of the fin shaped active region, thereby forming a three-dimensional channel region. In other words, in the fin type MOSFET according to one embodiment of the present invention, the three-dimensional channel region is formed beneath the lateral portions and the upper face of the fin shaped active region. Thus, the gate structure of the fin type MOSFET may advantageously control the length of the channel region in order to prevent a short channel effect from being generated therein. In addition, the fin type MOSFET has a stable structure in which the gate structure has a level upper face and a portion of the active region has a height substantially the same as that of a portion of a field region except portions of the active and field regions where the gate structures are located.

FIGS. 3A through 10B are cross-sectional views illustrating a method of manufacturing a fin type MOSFET in accordance with one embodiment of the present invention. FIGS. 3A, 4A, 5A, 6A, 7A, 8A, 9A, and 10A (FIGS. 3A through 10A) are cross sectional views illustrating the fin type MOSFET taken along a line between "I" and "I'" in FIG. 1. FIGS. 3B, 4B, 5B, 6B, 7B, 8B, 9B, and 10B (FIGS. 3B through 10B) are cross sectional views illustrating the fin type MOSFET taken along a line between "II" and "II'" in FIG. 1. The cross sectional views in FIGS. 3A through 10A are taken along a first direction parallel to a direction in which gate structures are arranged, and the cross sectional views in FIGS. 3B through 10B are taken along a second direction perpendicular to the direction where the gate structures are arranged.

Figure 3A:
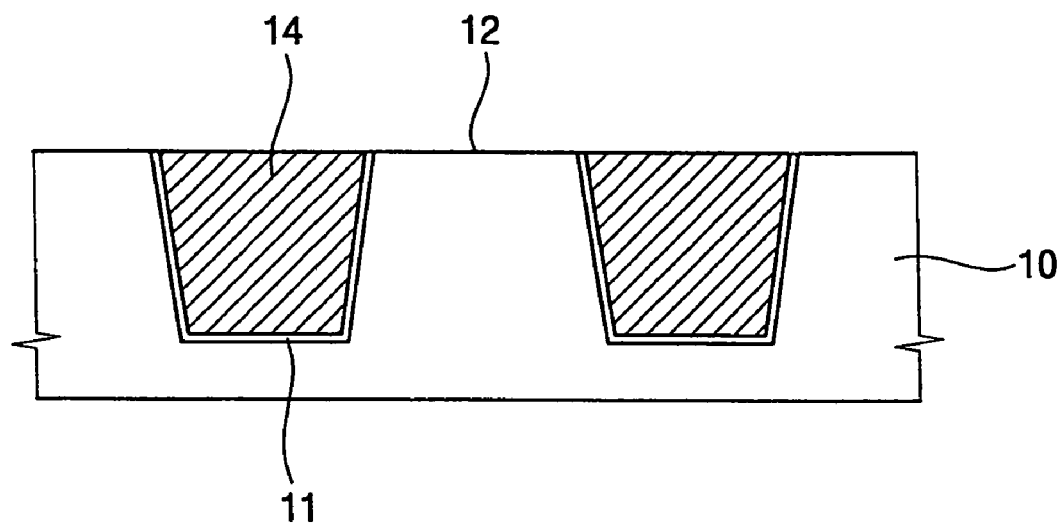
FIGS. 3A through 10B are cross-sectional views illustrating a method of manufacturing a fin type MOSFET in accordance with one embodiment of the present invention.
Figure 3B:
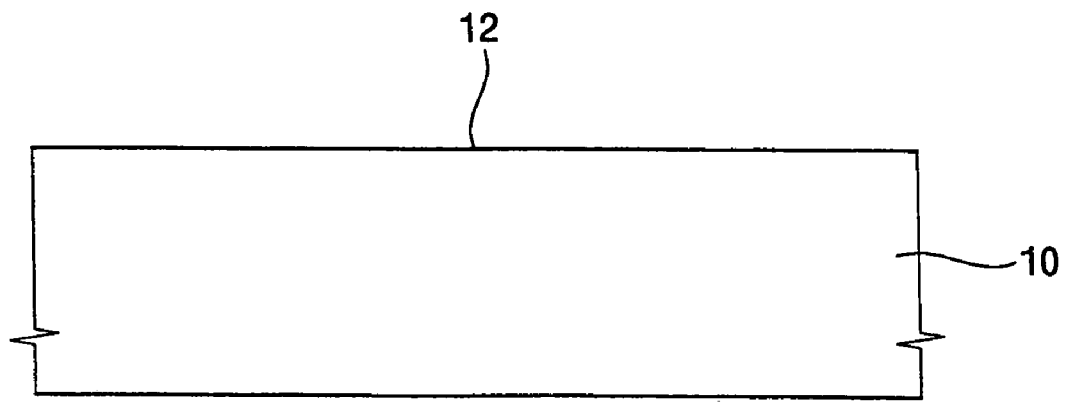

FIGS. 3A and 3B are cross sectional views illustrating the formation of active area 12 and field region 14.

Referring to FIGS. 3A and 3B, active area 12 and field area 14 are formed on semiconductor substrate 10 using an isolation process such as a shallow trench isolation (STI) process.

Active area 12 is divided into first active region 12a and second active region 12b as shown in FIG. 2A. Some gate structures are formed on first active region 12a but none are formed on second active region 12b. Additionally, field area 14 is also divided into first field region 14a and second field region 14b. Other gate structures are positioned in first field region 14a but none are positioned in second field region 14b.

In the process of forming active area 12 and field area 14, trenches are formed by partially etching portions of semiconductor substrate 10 where field area 14 is defined. First silicon nitride layer patterns are formed on inside surfaces of the trenches as trench liners 11. An oxide layer is formed on semiconductor substrate 10 to fill up the trenches, and then the oxide layer is partially removed by a chemical mechanical polishing (CMP) process or an etch back process, thereby forming field oxide layer patterns in the trenches. Trench liners 11 are interposed between inner sidewalls of the trenches and the field oxide layer patterns. Active area 12 is defined on semiconductor substrate 10 in accordance with the formation of field area 14.

Figure 4A:
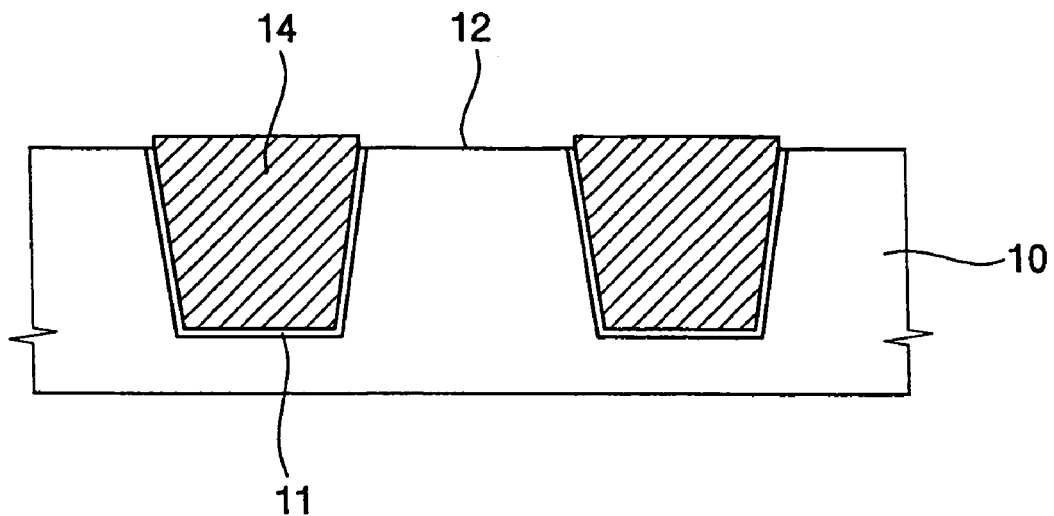
Figure 4B:
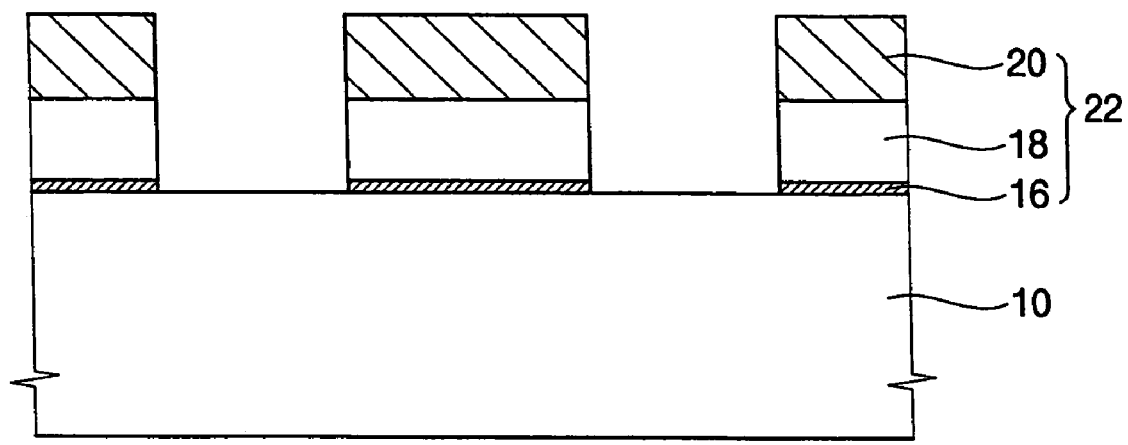

FIGS. 4A and 4B are cross sectional views illustrating the formation of gate trench patterns 22.

Referring to FIGS. 4A and 4B, a first buffer oxide layer, a second silicon nitride layer, and a silicon oxide layer are formed on semiconductor substrate 10 including active area 12 and field area 14.

The first buffer oxide layer reduces the stress generated in the formation of the second silicon nitride layer. The first buffer oxide layer typically has a thickness of about 100 Å measured from an upper face of semiconductor substrate 10.

Figure 9A:
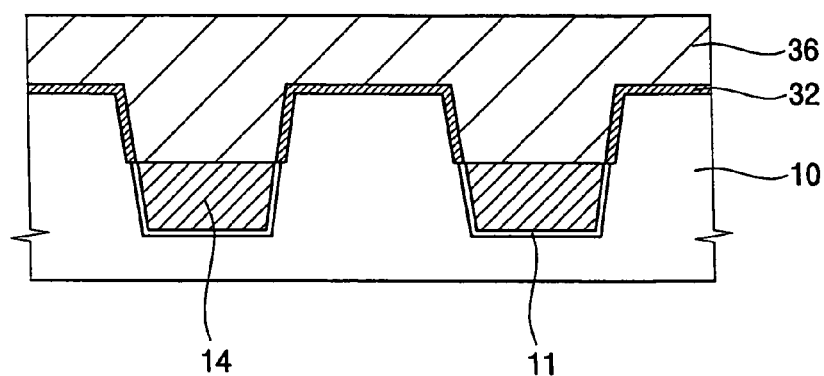
Figure 9B:
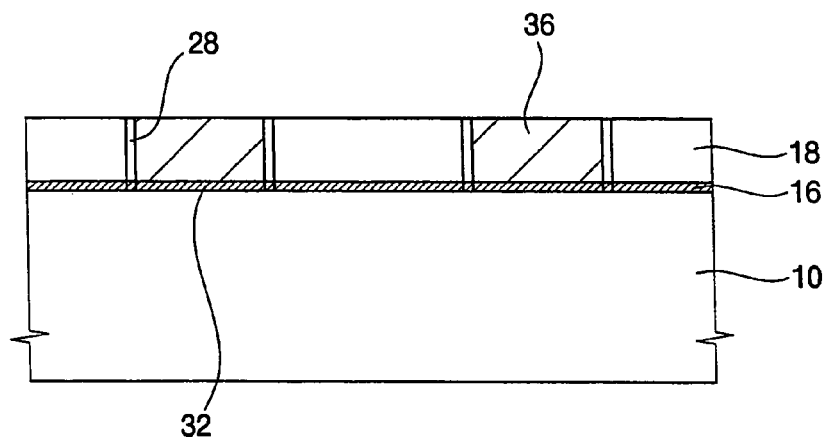

The second silicon nitride layer and the silicon oxide layer serve together as a mold layer for forming gate conductive patterns 36 (see FIGS. 9A and 9B). Thus, the second silicon nitride layer and the silicon oxide layer have a thickness sufficiently larger than the height of gate conductive patterns 36. The silicon oxide layer is typically formed using a high-density plasma (HDP) CVD process.

The silicon oxide layer, the second silicon nitride layer, and the first buffer oxide layer are partially etched to form gate trench patterns 22 on semiconductor substrate 10. Gate trench patterns 22 selectively expose portions of semiconductor substrate 10 where gate conductive patterns 36 will be formed. That is, gate trench patterns 22 are formed in second active region 12b and second field region 14b. After etching processes are performed to form gate trench patterns 22, each of the field oxide layer patterns filling the trenches in field area 14 protrudes slightly above the upper face of semiconductor substrate 10 as shown in FIG. 4A.

In one embodiment of the present invention, silicon oxide layer patterns 20 are formed on the second silicon nitride layer by partially etching the silicon oxide layer. Using silicon oxide layer patterns 20 as an etching mask, the second silicon nitride layer and the first buffer oxide layer are successively etched to thereby form second silicon nitride layer patterns 18 and first buffer oxide layer patterns 16 on semiconductor substrate 10. Thus, gate trench patterns 22 including first buffer oxide layer patterns 16, second silicon nitride layer patterns 18 and silicon oxide layer patterns 20 are formed on semiconductor substrate 10.

In another embodiment of the present invention, gate trench patterns 22 include second silicon nitride layer patterns 18 and/or the silicon oxide layer patterns 20 but not first buffer oxide layer patterns 16. Alternatively, gate trench patterns 22 may include patterns formed using a material having an etch selectivity relative to a gate conductive layer 34 (See, FIGS. 8A and 8B), which is subsequently formed. The term "etch selectivity" is used here to indicate that the material shows a different etch rate from gate conductive layer 34 under a specific condition. In some cases, for example, the patterns of gate trench patterns 22 are formed using oxide or nitride.

Referring now to FIGS. 4A and 4B, impurities are selectively implanted into first portions of semiconductor substrate 10 exposed between gate trench patterns 22 using an ion implantation process, thereby forming a channel region for the fin type MOSFET in the exposed first portions of semiconductor substrate 10. In the ion implantation process, impurities are implanted only into the exposed first portions of semiconductor substrate 10 where the channel region of the fin type MOSFET is formed, thereby reducing the junction capacitance of the fin type MOSFET.

In one embodiment of the present invention, the impurities are implanted into the exposed first portions of the semiconductor substrate 10 at any time before forming gate conductive layer 34.

Figure 5A:
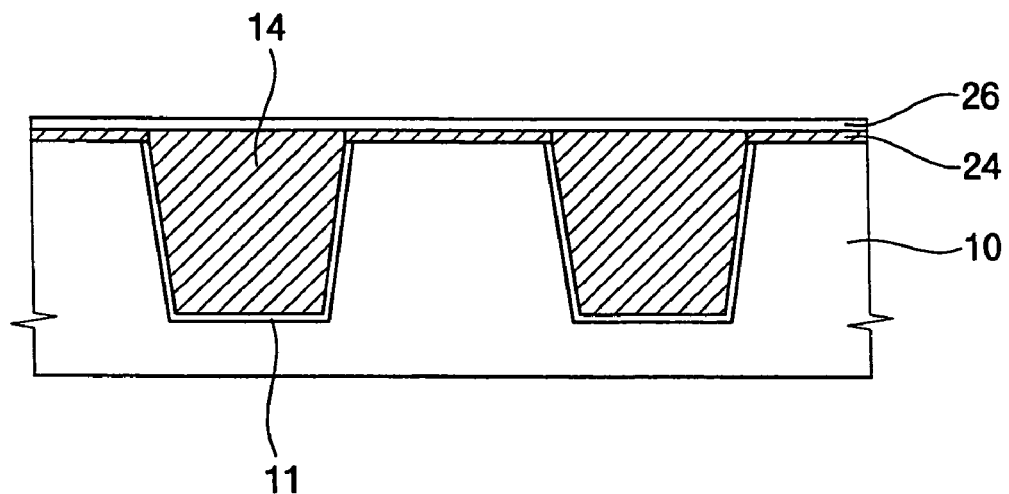
Figure 5B:
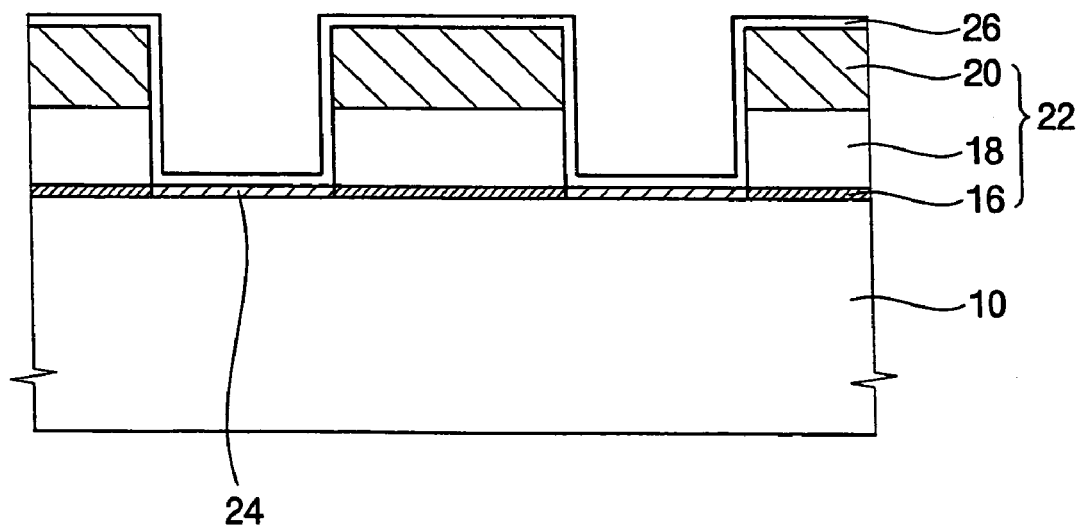

FIGS. 5A and 5B are cross sectional views illustrating the formation of second buffer oxide layer patterns 24 and an insulation layer 26.

Referring to FIGS. 5A and 5B, second buffer oxide layer patterns 24 are selectively formed on the exposed first portions of semiconductor substrate 10. Second buffer oxide layer patterns 24 are typically formed using a thermal oxidation process. Second buffer oxide layer patterns 24 reduce the stress generated in a process used to form inner spacers 28 (See, FIG. 6B) on sidewalls of gate trench patterns 22.

Insulation layer 26 is formed on semiconductor substrate 10 to cover gate trench patterns 22. Particularly, insulation layer 26 is continuously formed on second buffer oxide layer patterns 24, the sidewalls of gate trench patterns 22, field region 14, and upper faces of gate trench patterns 22. Insulation layer 26 is generally formed using a material having an etch selectivity relative to gate conductive layer 34. For example, insulation layer 26 typically includes a nitride such as silicon nitride or an oxide such as silicon oxide. Insulation layer 26 preferably includes silicon nitride.

Figure 6A:
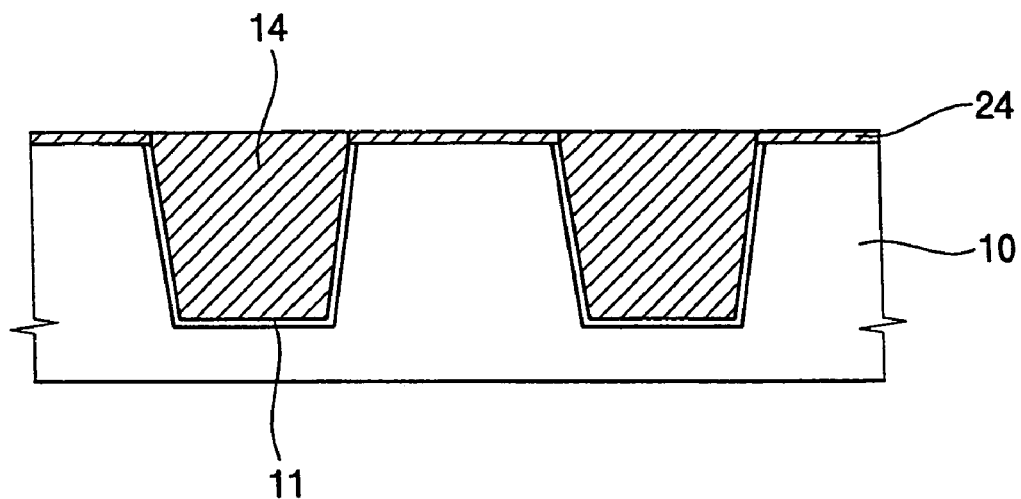
Figure 6B:
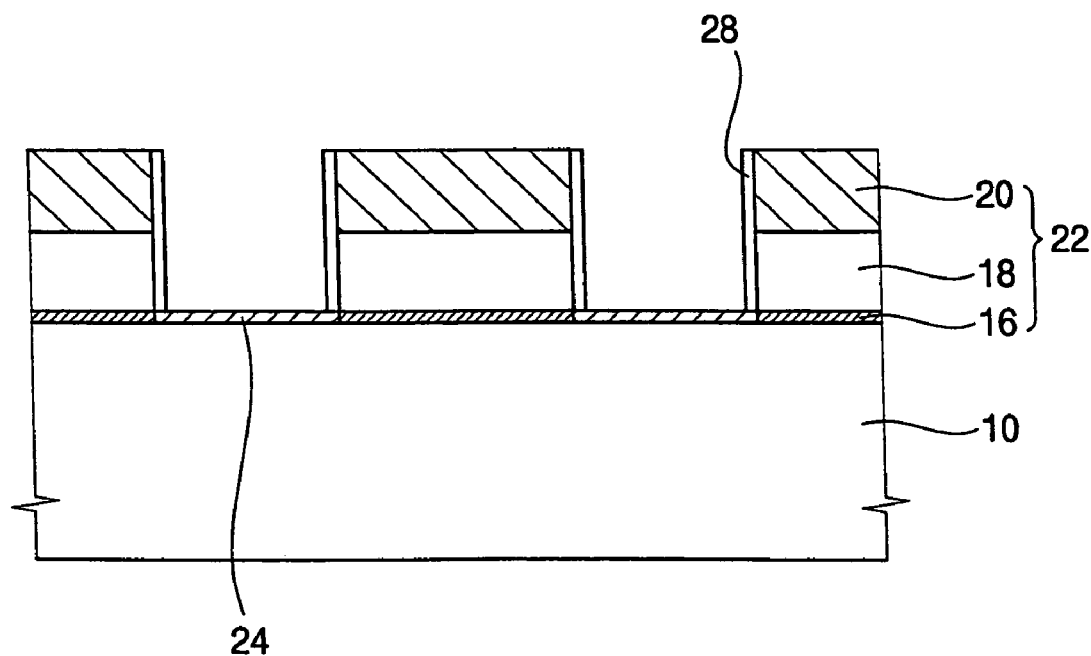

FIGS. 6A and 6B are cross sectional views illustrating the formation of inner spacers 28.

Referring to FIGS. 6A and 6B, insulation layer 26 is partially etched to form inner spacers 28 on the respective sidewalls of gate trench patterns 22. Insulation layer 26 is typically anisotropically etched. Where inner spacers 28 include silicon nitride, recesses are generally not formed in the surface portion of semiconductor substrate 10 because second buffer oxide layer patterns 24 serve as etch stop layers in successive etching processes.

Each of inner spacers 28 decreases the size of the exposed first portions of semiconductor substrate 10 between gate trench patterns 22, and therefore gate conductive pattern 36 formed at the exposed first portions of the substrate 10 has a reduced width. That is, gate conductive pattern 36 generally has a very minute width due to the formation of inner spacers 28 because the thickness of inner spacers 28 effectively adjusts the width of the exposed first portions of semiconductor substrate 10. Alternatively, the formation of inner spacers 28 on the sidewalls of gate trench pattern 22 may be omitted to give gate electrode pattern 36 greater width.

Figure 7A:
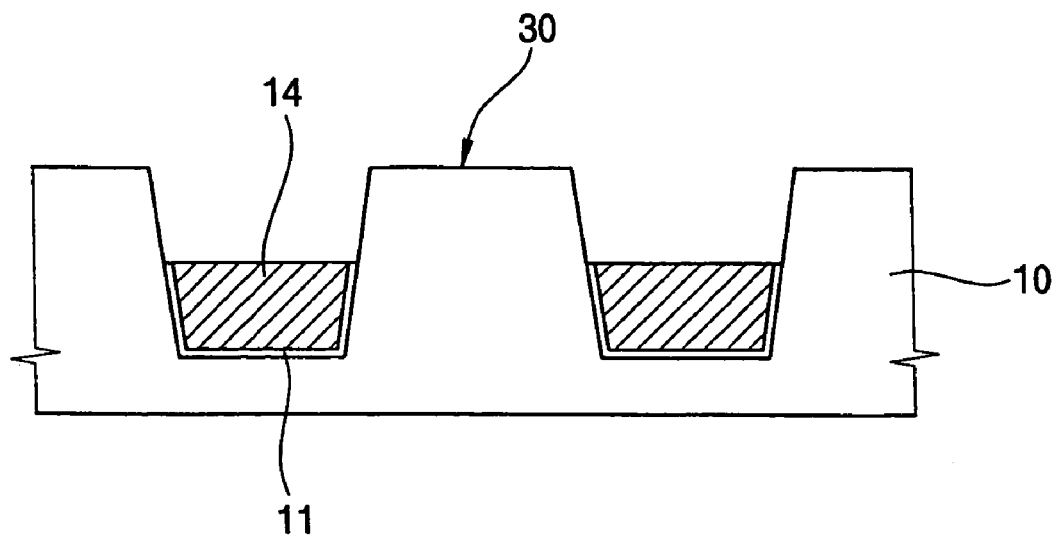
Figure 7B:
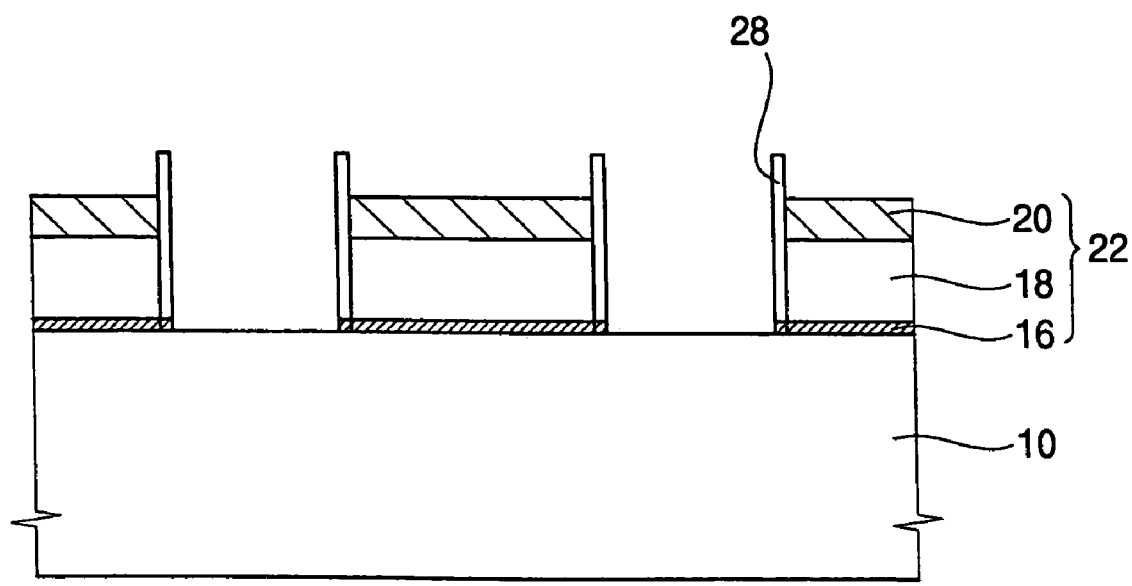

FIGS. 7A and 7B are cross sectional views illustrating the completion of active area 12 and field area 14.

Referring to FIGS. 7A and 7B, the field oxide layer patterns filling the trenches in field area 14, and silicon oxide layer patterns 20 are partially etched by an etching process using an etching solution or an etching gas that selectively etches oxide. Simultaneously, second buffer oxide layer patterns 24 are removed from semiconductor substrate 10 so that the first portions of semiconductor substrate 10 between gate trench patterns 22 are re-exposed.

Where field oxide layer patterns in the trench are partially removed, upper portions of trench liners 11 are exposed. The exposed upper portions of trench liners 11 are removed from the inside of the trenches. In addition, inner spacers 28 protrude over upper faces of silicon oxide layer patterns 20 after silicon oxide layer patterns 20 of gate trench patterns 22 have been partially etched. Alternatively, silicon oxide layer patterns 20 are completely removed from second silicon nitride layer patterns 18.

Where the field oxide layer patterns in the trenches are partially etched, the first portions of semiconductor substrate 10 including the trenches are re-exposed. A fin shaped active region 30 is formed on semiconductor substrate 10 as a result of reducing the height of field region 14 by partially etching the field oxide layer patterns formed in the trenches thereof. Fin shaped active region 30 typically has increased height relative to the field oxide layer patterns in the trenches due to the etching process. In other words, because gate trench patterns 22 are formed in second active region 12b and second field region 14b, only the field oxide layer patterns in first field region 14a are partially removed. As a result, the step is generated between first active region 12a and first field region 14a where the conductive structures such as the gate structures are formed. In other words, first field region 14a has a height substantially smaller than that of first active region 12a. However, second field region 14b has a height substantially the same as that of second active region 12b because the filed oxide layer patterns in second field region 14b are not etched.

Figure 8A:
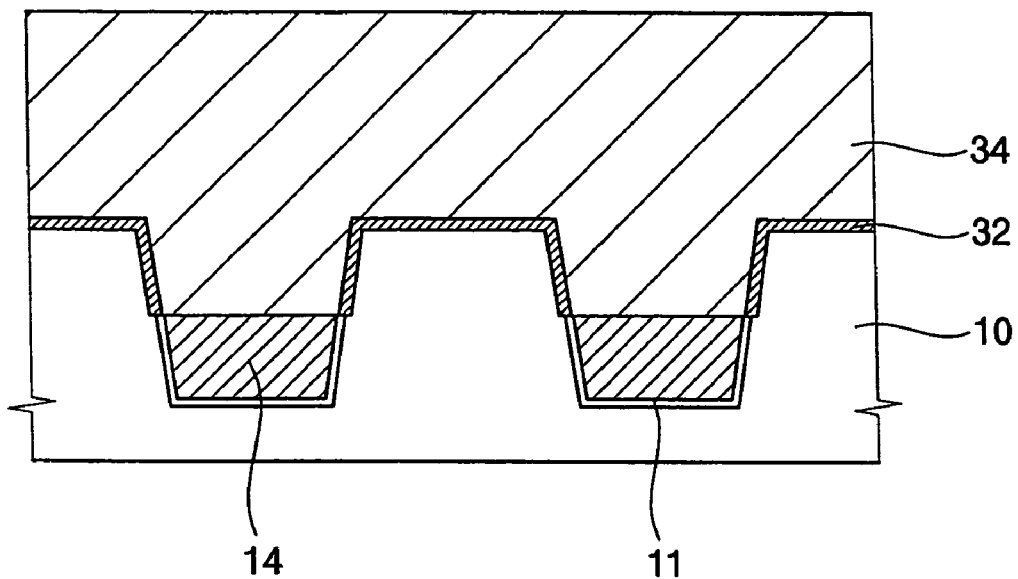
Figure 8B:
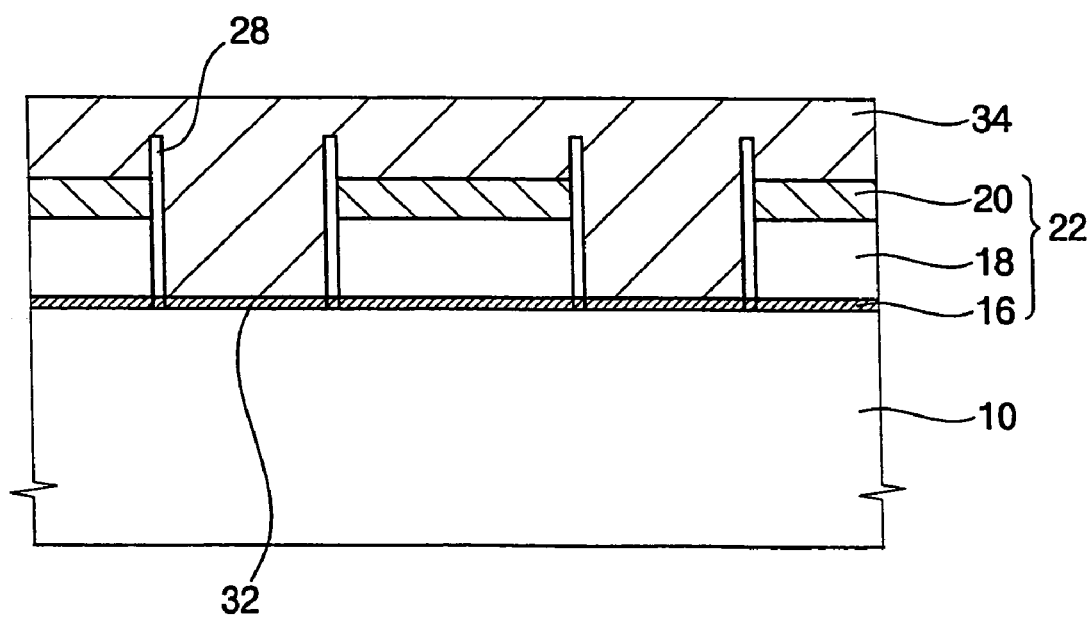

FIGS. 8A and 8B are cross sectional views illustrating the formation of gate insulation patterns 32 and gate conductive layer 34.

Referring to FIGS. 8A and 8B, gate conductive layer 34 is formed on semiconductor substrate 10 to cover gate trench patterns 22 and to fill up the trenches. Gate conductive layer 34 is typically formed using a conductive material such as polysilicon doped with impurities or metal. Here, gate conductive layer 34 completely covers gate trench patterns 22. In other words, gate conductive layer 34 has a sufficient height above the exposed first portions of semiconductor substrate 10 to fully cover gate trench patterns 22. Additionally, gate conductive layer 34 completely covers the trenches in which the partially etched field oxide layer patterns are positioned, adjacent to fin shaped active region 30. In general, gate conductive layer 34 has a thickness substantially higher than gate trench patterns 22.

FIGS. 9A and 9B are cross sectional views illustrating the formation of gate conductive patterns 36.

Referring to FIGS. 9A and 9B, gate conductive layer 34 is partially removed until second silicon nitride layer patterns 18 of gate trench patterns 22 are exposed to thereby form gate conductive patterns 36 separated from each other by gate trench patterns 22. Therefore, the gate structures including gate insulation patterns 32 and gate conductive patterns 36 are formed on first portions of semiconductor substrate 10 between gate trench patterns 22. After gate conductive layer 34 is partially removed using a CMP process, each of the gate conductive patterns 36 has a level upper face. Here, the height of gate conductive patterns 36 may be advantageously adjusted by controlling the processing conditions or the processing time of the CMP process. Gate conductive patterns 36 typically have a relatively small height where the CMP process is performed for a relatively long time. On the other hand, gate conductive patterns 36 typically have a relatively large height when the CMP process is executed for a relatively short time.

Since gate conductive patterns 36 are formed by a damascene process that employs the CMP process without a photolithography process, gate conductive patterns 36 are self-aligned with respect to active area 12. Hence, an additional process for aligning gate conductive patterns 36 relative to active area 12 is generally not required. In addition, potential processing failures associated with the photolithography process are prevented from occurring. Further, etched residues are eliminated from areas on or near gate conductive patterns 36, thereby preventing the electrical failure of the fin type MOSFET.

Where gate conductive patterns 36 are formed on the first portions of semiconductor substrate 10, silicon oxide layer patterns 20 of gate trench patterns 22 are completely removed. Thus, the gate structures are encompassed by second silicon nitride layer patterns 18 and first buffer oxide layer patterns 16.

Figure 10A:
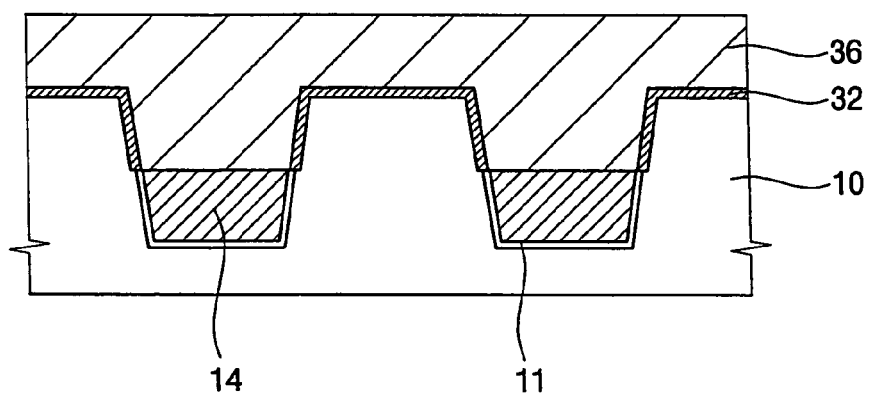
Figure 10B:
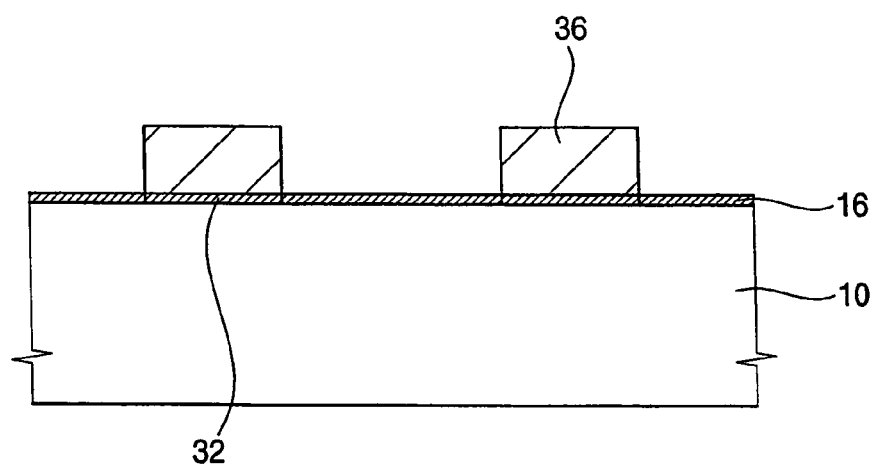

FIGS. 10A and 10B are cross sectional views illustrating the completion of a MOSFET.

Referring to FIGS. 10A and 10B, gate trench patterns 22 are removed from semiconductor substrate 10. Impurities are implanted into second portions of semiconductor substrate 10 exposed between gate conductive patterns 36 using an ion implantation process, thereby forming source/drain regions in the exposed second portions of semiconductor substrate 10. As a result, the fin type MOSFET is formed on semiconductor substrate 10.

As described above, the fin type MOSFET includes a fin shaped active region where the gate structures are selectively formed. When the gate structures are formed by a damascene process, residues typically do not remain on the gate structures or a substrate, thereby preventing electrical failure of the fin type MOSFET.

Figure 11:
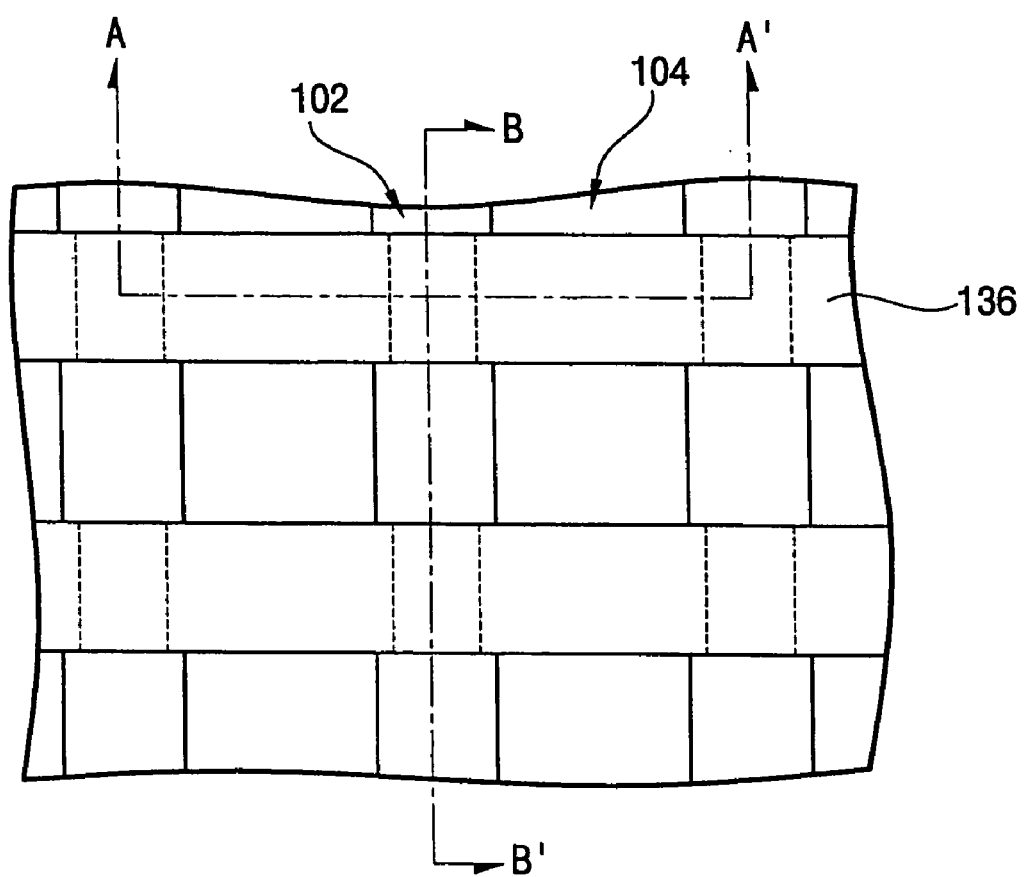
FIG. 11 is a planar view illustrating a fin type MOSFET in accordance with one embodiment of the present invention.
Figure 12A:
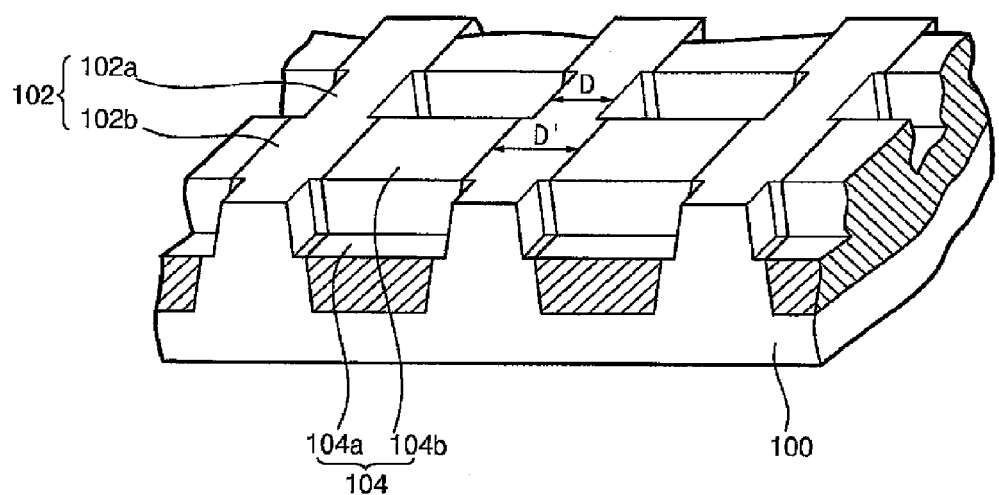
FIG. 12A is a perspective view illustrating an active area and a field area of the fin type MOSFET in FIG. 11.
Figure 12B:
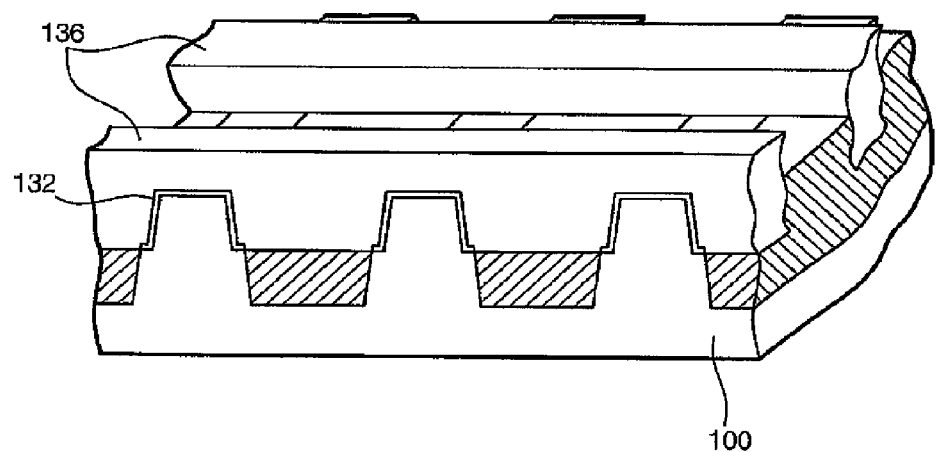
FIG. 12B is a perspective view illustrating the fin type MOSFET in FIG. 11; and, FIGS. 13A to 16B are cross-sectional views illustrating a method of manufacturing a fin type MOSFET in accordance with one embodiment of the present invention.

FIG. 11 is a planar view illustrating a fin type MOSFET in accordance with one embodiment of the present invention, FIG. 12A is a perspective view illustrating an active area and a field area of the fin type MOSFET in FIG. 11, and FIG. 12B is a perspective view illustrating the fin type MOSFET in FIG. 11.

Referring to FIGS. 11, 12A and 12B, the fin type MOSFET has a semiconductor substrate 100 including an active area 102 and a field area 104. Where isolation layer patterns are formed on semiconductor substrate 100, semiconductor substrate 100 is divided into active area 102 and field area 104.

Conductive structures including gate structures, source/drain regions and/or a contact are generally present in active area 102. The gate structures include gate insulation patterns 132 and gate conductive patterns 136 as shown in FIG. 16B. Field area 104 includes a trench formed in a surface portion of semiconductor substrate 100 and a field oxide layer pattern filling the trench. Field area 104 electrically isolates one conductive structure from another conductive structure.

Active area 102 is divided into a first active region 102a and a second active region 102b. First active region 102a makes contact with second active region 102b. First and second active regions 102a and 102b are formed on semiconductor substrate 100 along a first direction. Some gate structures are formed in first active region 102a and source/drain regions and/or a contact are positioned in second active region 102b. First active region 102a has a width "D" which is substantially smaller than a width "D'" of second active region 102b as shown in FIG. 12A. The widths "D" and "D'" of first and second active regions 102a and 102b correspond to the length of a channel along a direction perpendicular to a direction where a drain current flows. Because first active region 102a has the relatively small width "D", the gate structures typically have an enhanced channel driving force. Additionally, the fin type MOSFET typically has a reduced contact resistance because second active region 102b has the relatively large width "D'" where the contact exists.

Field area 104 includes a first field region 104a and a second field region 104b. Second field region 104b makes contact with second active region 102b along a second direction perpendicular to the first direction. Other gate structures are positioned in first field region 104a.

First active region 102a has a height substantially larger than that of first field region 104a. Hence, a step is formed between first active region 102a and first field region 104a. Second active region 102b has a height substantially the same as that of second field region 104b. Also, second field region 104b has a height substantially the same as that of first active region 102a.

Gate insulation patterns 132 are formed on first active region 102a and first field region 104a. Gate insulation patterns 132 are typically formed by a thermal oxidation process using oxide. Gate conductive patterns 136 are positioned on gate insulation patterns 132. Gate conductive patterns 136 completely cover the step between first active region 102a and first field region 104a. In addition, gate conductive pattern 136 has a level upper face.

FIGS. 13A to 16B are cross-sectional views illustrating a method of manufacturing a fin type MOSFET in accordance with one embodiment of the present invention. FIGS. 13A, 14A, 15A and 16A (FIGS. 13A through 16A) are cross sectional views illustrating the fin type MOSFET taken along a line between "A" and "A'" in FIG. 11. FIGS. 13B, 14B, 15B and 16B (FIGS. 13B through 16B) are cross sectional views illustrating the fin type MOSFET taken along a line between "B" and "A'" in FIG. 11. In particular, FIGS. 13A through 16A are cross sectional views taken along a first direction parallel to a direction where gate structures are arranged, and FIGS. 13B, through 16B are cross sectional views taken along a second direction perpendicular to the direction where the gate structures are arranged. In the present embodiment, first active region 102a has width smaller than that of first active region 12a in FIG. 2A.

Figure 13A:
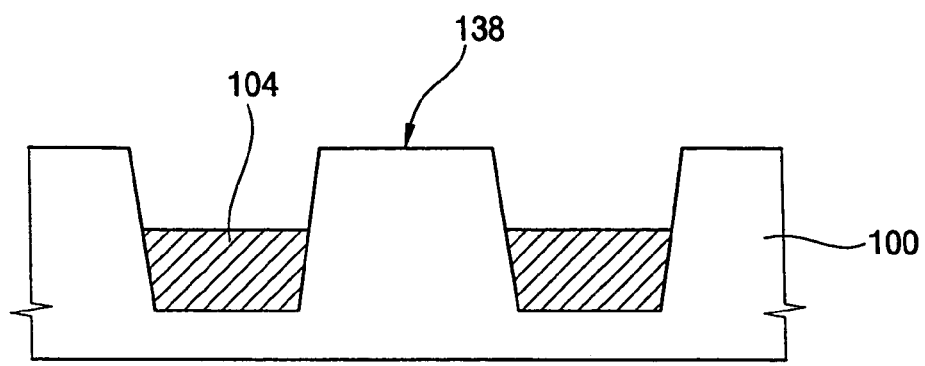
Figure 13B:
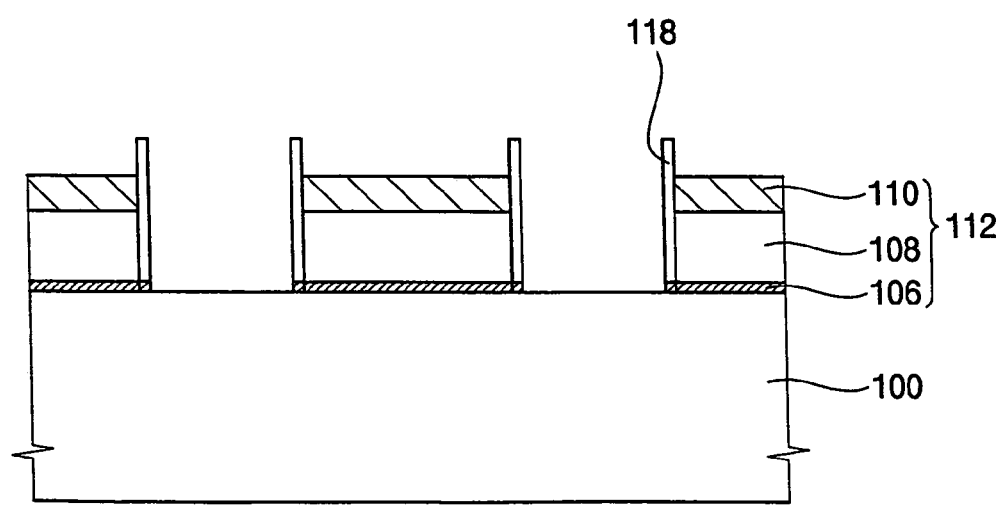

FIGS. 13A and 13B are cross sectional views illustrating the formation of gate trench patterns 112.

Referring to FIGS. 13A and 13B, active area 102 and field area 104 are formed on semiconductor substrate 100 using an isolation process such as an STI process. Active area 102 is divided into first active region 102a and second active region 102b. Field area 104 is divided into first field region 104a and second field region 104b. Gate structures are formed in first active region 102a but not in second active region 102b. Other gate structures are positioned in first field region 104a but not in second field region 104b.

The trenches are formed by partially etching portions of semiconductor substrate 100 where field area 104 is defined. First silicon nitride layer patterns are formed on inside surfaces of the trenches as trench liners. An oxide layer filling the trenches is formed on semiconductor substrate 100, and then the oxide layer is partially removed using a CMP process or an etch back process. Hence, the field oxide layer patterns are formed in the trenches. When field area 104 is formed on semiconductor substrate 100, the active area 102 is defined on semiconductor substrate 100.

A first buffer oxide layer, a second silicon nitride layer and a first silicon oxide layer are successively formed on semiconductor substrate 100. The first silicon oxide layer, the second silicon nitride layer and the first buffer oxide layer are partially etched to form gate trench patterns 112 on semiconductor substrate 100. Gate trench patterns 112 include first buffer oxide layer patterns 106, second silicon nitride layer patterns 108 and first silicon oxide layer patterns 110, respectively. Gate trench patterns 112 are formed in second active region 102b and second field region 104b. In one embodiment of the present invention, gate trench patterns 112 Include second silicon nitride layer patterns 108 and first buffer oxide layer patterns 106. Alternatively, gate trench patterns 112 include only second silicon nitride layer patterns 108. It is disadvantageous for gate trench patterns 112 to include only first silicon oxide layer patterns 110, which will be explained hereafter. Gate trench patterns 112 selectively expose first portions of semiconductor substrate 100 where gate conductive patterns 136 will be formed.

Impurities are selectively implanted into first portions of semiconductor substrate 100 exposed between gate trench patterns 112 using an ion implantation process to thereby form the channel region of the fin type MOSFET at exposed first portions of semiconductor substrate 100. Here, the impurities are typically implanted into the exposed first portions of semiconductor substrate 100 at any time before a gate conductive layer is formed.

After second buffer oxide layer patterns are selectively formed on the exposed first portions of semiconductor substrate 100 using a thermal oxidation process, an insulation layer for inner spacers 118 is formed on semiconductor substrate 100 to cover gate trench patterns 112. The insulation layer is continuously formed on the second buffer oxide layer patterns, the sidewalls and upper faces of gate trench patterns 112, and field region 104.

The insulation layer is partially anisotropically etched to form inner spacers 118 on the sidewalls of gate trench patterns 112. Inner spacers 118 are typically formed using insulation material having an etch selectivity relative to the gate conductive layer and oxide. For example, inner spacers 118 commonly include a nitride such as silicon nitride.

The field oxide layer patterns in field area 104 are partially etched to form a preliminary fin shaped active region 138. Preliminary fin shaped active region 138 protrudes from the etched field oxide layer patterns. In other words, preliminary fin shaped active region 138 has a height relatively higher than portions of field area 104. Preliminary fin shaped active region 138 is positioned on the portion Semiconductor substrate 100 where gate conductive patterns 136 are formed.

Figure 14A:
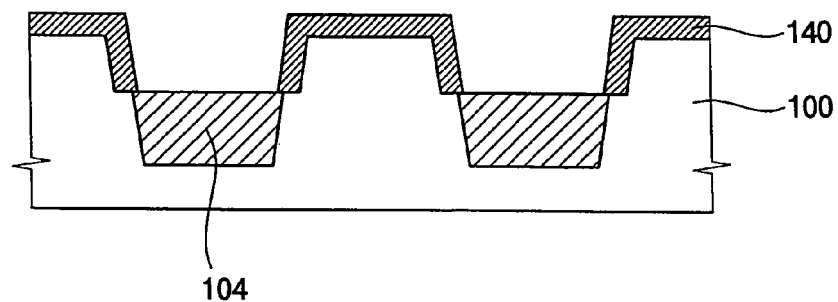
Figure 14B:
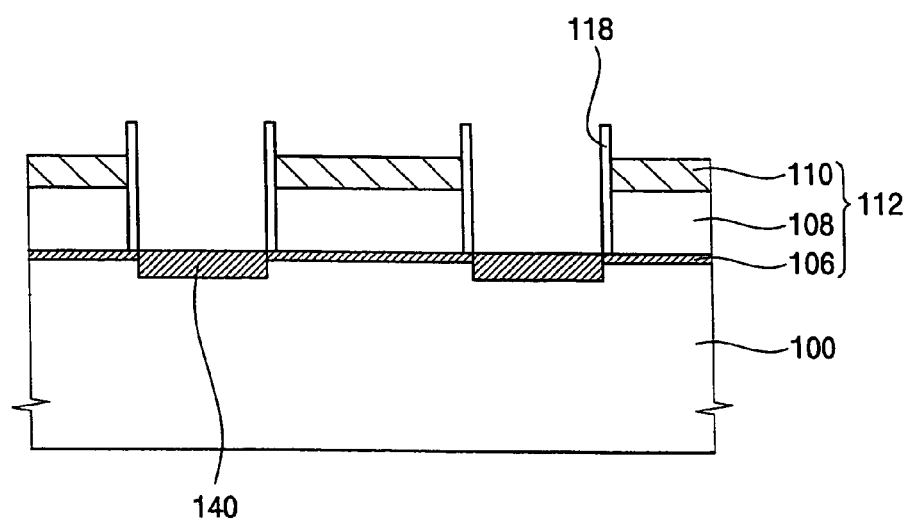

FIGS. 14A and 14B are cross sectional views illustrating the formation of second silicon oxide layer patterns 140.

Referring to FIGS. 14A and 14B, second silicon oxide layer patterns 140 are formed on semiconductor substrate 100 by oxidizing semiconductor substrate 100. In particular, second silicon oxide layer patterns 140 are formed on preliminary fin shaped active region 138, and field area 104. Here, second silicon oxide layer patterns 140 are formed on the upper sidewalls of the trenches exposed by partially etching the field oxide layer patterns as described above. Also, second oxide layer patterns 140 are formed on the exposed first portions of semiconductor substrate 100 between gate trench patterns 112. Second silicon oxide layer patterns 140 generally trim lateral portions of preliminary fin shaped active region 138. Therefore, as the thickness of second oxide layer pattern 140 increases, the width of a fin shaped active region 142 (see FIG. 15A) decreases.

Figure 15A:
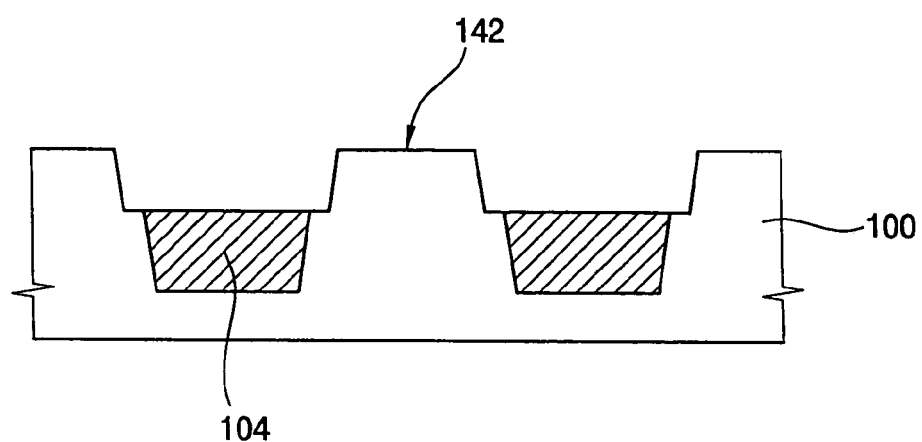
Figure 15B:
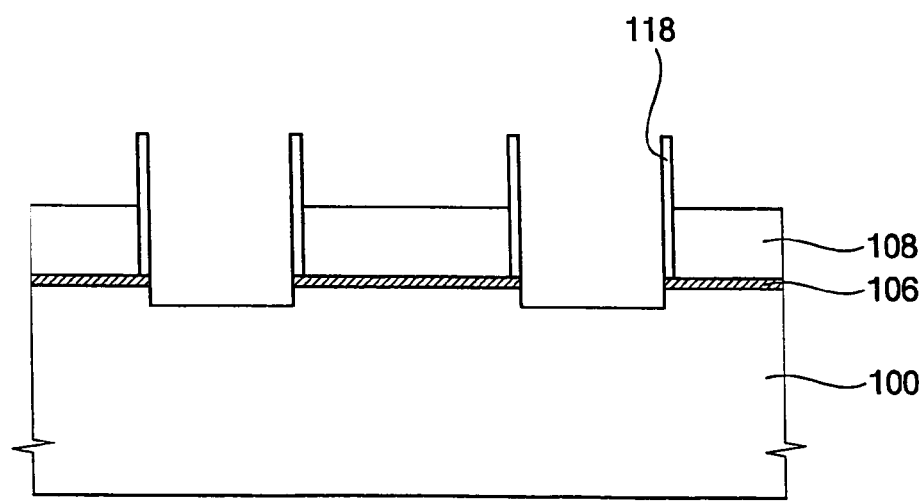

FIGS. 15A and 15B are cross sectional views illustrating the formation of fin shaped active region 142.

Referring to FIGS. 15A and 15B, second silicon oxide layer patterns 140 are removed from semiconductor substrate 100, thereby forming fin shaped active region 142 for the fin type MOSFET on semiconductor substrate 100. Second silicon oxide layer patterns 140 may be advantageously removed using a wet etching process because the wet etching process efficiently removes second silicon oxide layer patterns 140 without damaging the profiles of the resultant structures formed on semiconductor substrate 100.

Where second silicon oxide layer patterns 140 are removed using the wet etching process, inner spacers 118 are not removed. Where the inner spacers 118 are removed together with second oxide layer patterns 140, the width of the gate structure formed on the exposed first portion of semiconductor substrate 100 is generally not readily adjusted. In addition, second silicon nitride layer patterns 108 of gate trench patterns 112 are not etched although first silicon oxide layer patterns 110 are typically removed when the second silicon oxide layer patterns 140 are removed. Thus, second silicon nitride layer patterns 108 serve as mold layers for forming the gate structures. Where second silicon nitride layer patterns 108 are removed with second silicon oxide layer patterns 140, the gate structures are generally not formed on the exposed first portions of semiconductor substrate 100 using a damascene process. Where gate trench patterns 112 include first silicon oxide layer patterns 110 only, gate trench patterns 112 are removed in the etching process for removing second silicon oxide layer patterns 140. Thus, gate trench patterns 112 include second silicon nitride layer patterns 108 so as to form the gate structures on exposed first portions of semiconductor substrate 100 between gate trench patterns 112.

Referring now to FIGS. 15A and 15B, where second silicon oxide layer patterns 140 are removed, the width of preliminary fin shaped active region 138 is reduced in proportion to the thickness of second silicon oxide layer pattern 140, thereby forming fin shaped active region 142 (first active region 102a) having a width smaller than that of preliminary fin shaped active region 138. Therefore, first active region 102a has a width substantially smaller than that of second active region 102b shown in FIG. 12A.

Where second silicon oxide layer patterns 140 are etched, the exposed first portions of semiconductor substrate 100 are typically slightly recessed in proportion to the thickness of second silicon oxide layer patterns 140. In other words, light recesses are formed in exposed first portions of semiconductor substrate 100.

Figure 16A:
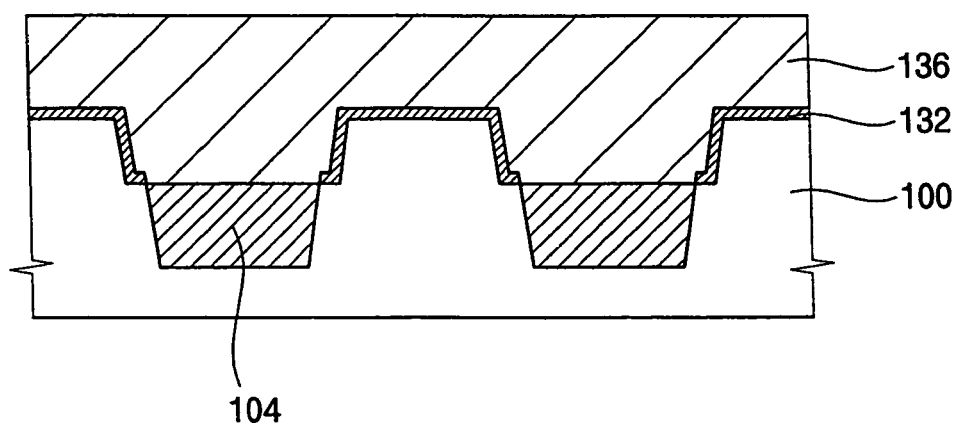
Figure 16B:
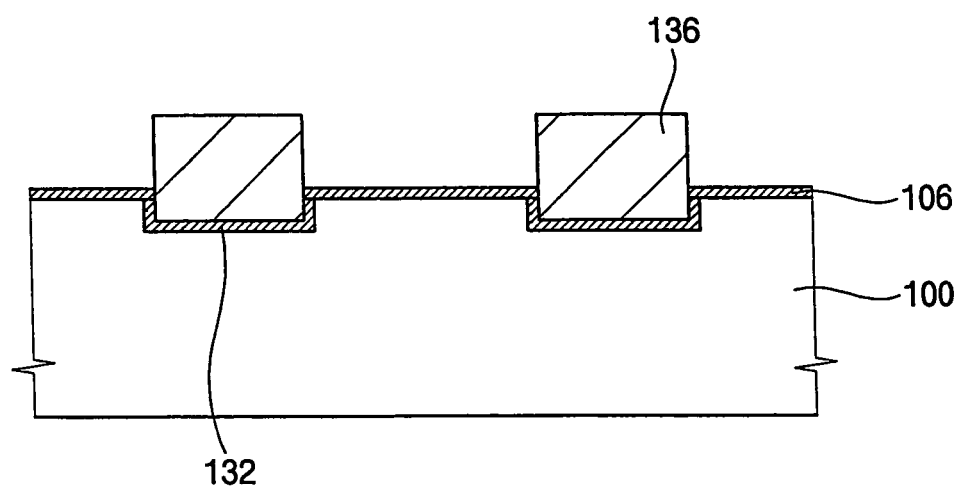

FIGS. 16A and 16B are cross sectional views illustrating steps of forming gate insulation patterns 132 and the gate conductive patterns 136.

Referring to FIGS. 16A and 16B, gate insulation layer patterns 132 are formed on semiconductor substrate 100 by performing a thermal oxidation process on surface portions of semiconductor substrate 100.

The gate conductive layer is formed on gate insulation layer patterns 132 using doped polysilicon or metal to cover gate trench patterns 112 and to fill the trenches. The gate conductive layer is partially removed using a CMP process until second silicon nitride layer patterns 108 of gate trench patterns 112 are exposed. Thus, gate conductive patterns 136, which are separated from each other by gate trench patterns 112, are formed on the exposed first portions of semiconductor substrate 100.

After gate trench patterns 112 are removed from semiconductor substrate 100, impurities are implanted into second portions of semiconductor substrate 100 exposed between gate conductive patterns 136 using an ion implantation process so that source/drain regions are formed in the exposed second portions of semiconductor substrate 100. Therefore, the fin type MOSFET is formed on semiconductor substrate 100.

As described above, the fin type MOSFET includes a fin shaped active region where gate structures are selectively formed. In addition, the fin shaped active region has a relatively narrow width so that the fin type MOSFET has an enhanced channel driving force. Furthermore, the fin type MOSFET includes relatively wide source/drain regions and a contact, thereby reducing the contact resistance thereof.

According to the present invention, the gate structures of the fin type MOSFET are formed by a damascene process without using a photolithography process, thereby advantageously adjusting the widths of the gate structures. In addition, impurities used to form a channel region are selectively implanted into the portions of the substrate adjacent to the gate structures so that the fin type MOSFET has reduced junction capacitance.

The foregoing embodiments of the present invention are teaching examples. Those of ordinary skill in the art will understand that various changes in form and details may be made to the exemplary embodiments without departing from the scope of the present invention defined by the following claims.

What is claimed is:

1. A semiconductor device comprising:
   a semiconductor substrate having an active area and a field area;
   a first active region formed in the active area;
   a second active region formed in the active area;
   a first field region formed in a first portion of the field area, wherein an upper face of the first field region is disposed lower than an upper face of the first active region;
   a second field region formed in a second portion of the field area, wherein an upper face of the second field region is disposed level with an upper face of the second active region; and,
   a gate structure formed in the first active region and the first field region,
   wherein the gate structure is formed over the upper face of the first active region, and the second active region is adjacent to the second field region.

2. The semiconductor device of claim 1, wherein the upper face of the first active region is disposed level with the upper face of the second active region.

3. The semiconductor device of claim 1, wherein the gate structure comprises a gate insulation pattern and a gate conductive pattern.

4. The semiconductor device of claim 3, wherein the gate conductive pattern has a level upper face.

5. The semiconductor device of claim 3, wherein the gate conductive pattern covers a step between the first active region and the first field region.

6. The semiconductor device of claim 1, wherein a width of the first active region is the same as a width of the second active region.

7. A semiconductor device comprising:
   a semiconductor substrate having an active area and a field area;
   a first active region formed in the active area;
   a second active region formed in the active area and having a width larger than a width of the first active region;
   a first field region formed in a first portion of the field area, wherein an upper face of the first field region is disposed lower than an upper face of the first active region;
   a second field region formed in a second portion of the field area, wherein an upper face of the second field region is disposed level with an upper face of the second active region; and,
   a gate structure formed in the first active region and the first field region,
   wherein the gate structure is formed over the upper face of the first active region, and
   wherein the second active region is adjacent to the second field region.

8. The semiconductor device of claim 7, wherein the upper face of the first active region is disposed level with the the upper face of the second active region.

9. The semiconductor device of claim 7, wherein the gate structure comprises a gate insulation pattern and a gate conductive pattern.

10. The semiconductor device of claim 9, wherein the gate conductive pattern has a level upper face.

11. The semiconductor device of claim 9, wherein the gate conductive pattern covers a step between the first active region and the first field region.

12. The semiconductor device of claim 7, wherein a drain current flows in a first direction, and the width of the first active region and the width of the second active region are each perpendicular to the first direction.

13. The semiconductor device of claim 7, wherein the second active region comprises a source/drain region.

14. The semiconductor device of claim 7, wherein the first and second active regions are adjacent to one another along a first direction and the second field region is adjacent to the second active region along a second direction perpendicular to the first direction.

15. The semiconductor device of claim 6, wherein a drain current flows in a first direction, and the width of the first active region and the width of the second active region are each perpendicular to the first direction.

16. The semiconductor device of claim 1, wherein the second active region comprises a source/drain region.

17. The semiconductor device of claim 1, wherein:
the field area comprises a field oxide layer pattern comprising the first and second field regions; and,
a trench liner is interposed between the semiconductor substrate and the field oxide layer pattern.

18. A semiconductor device comprising:
a semiconductor substrate having an active area and a field area;
a first active region formed in the active area;
a second active region formed in the active area and adjacent to the first active region along a first direction;
a first field region formed in a first portion of the field area, wherein an upper face of the first field region is disposed lower than an upper face of the first active region;
a second field region formed in a second portion of the field area, wherein an upper face of the second field region is disposed level with an upper face of the second active region, and the second field region is formed adjacent to the second active region along a second direction perpendicular to the first direction; and,
a gate structure formed in the first active region and the first field region,
wherein the gate structure comprise a gate insulation pattern and a gate conductive pattern,
the gate structure is formed over the upper face of the first active region, and
the second active region is adjacent to the second field region.

19. The semiconductor device of claim 1, wherein the gate structure surrounds two lateral portions of the first active region and covers the upper face of the first active region.

* * * * *